United States Patent
Wu

(10) Patent No.: US 7,194,712 B2
(45) Date of Patent: Mar. 20, 2007

(54) METHOD AND APPARATUS FOR IDENTIFYING LINE-END FEATURES FOR LITHOGRAPHY VERIFICATION

(75) Inventor: James Xiaqing Wu, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 405 days.

(21) Appl. No.: 10/845,566

(22) Filed: May 12, 2004

(65) Prior Publication Data

US 2005/0257181 A1  Nov. 17, 2005

(51) Int. Cl.
*G06F 17/50* (2006.01)
(52) U.S. Cl. ............... 716/5; 716/4; 716/11; 716/21
(58) Field of Classification Search ............ 716/11, 716/19–21, 4–5; 430/5, 30
See application file for complete search history.

(56) References Cited

U.S. PATENT DOCUMENTS 6,670,081 B2 * 12/2003 Laidig et al. ............... 430/5
7,005,218 B2 * 2/2006 Zhang ............................ 430/5

OTHER PUBLICATIONS

Balasinski et al., "Comparsion of Mask Writing Tools and Mask Simulations for 0.16um Devices," IEEE, Sep. 1999, pp. 372-377.*
Strojwas et al., "Layout Manufacturability Analysis Using Regorous 3-D Topography Simulation," IEEE, Oct. 2001, pp. 263-266.*
Balasinski et al., "A Novel Approach to Simulate the Effect of Optical Proximity on MOSFET Parametric Yield," IEDM, 1999, pp. 37-6.1-37.6.4.*

* cited by examiner

*Primary Examiner*—Vuthe Siek
(74) *Attorney, Agent, or Firm*—Park, Vaughan & Fleming, LLP

(57) ABSTRACT

One embodiment of the invention provides a system that facilitates identifying line-end features in a layout for an integrated circuit. The system operates by first receiving the layout for the integrated circuit. Next, the system selects a polygon from the layout and marks a line-end seed on the polygon. The system then determines if the line-end seed is associated with a line feature, and if so, the system marks the line-end feature inside the line feature.

24 Claims, 6 Drawing Sheets

METHOD AND APPARATUS FOR IDENTIFYING LINE-END FEATURES FOR LITHOGRAPHY VERIFICATION

BACKGROUND

1. Field of the Invention

The invention relates to techniques for verifying circuit layouts for semiconductor chips. More specifically, the invention relates to a method and an apparatus for identifying line-end features for lithography verification.

2. Related Art

As semiconductor integration densities continue to increase at an exponential rate, circuits are becoming increasingly larger, which makes it more computationally expensive to simulate the final printed image for a circuit layout. Consequently, such simulations are usually performed only for certain identified critical regions in the circuit based on the relative locations of specific features that are likely to cause problems, such as line ends.

Furthermore, because of increasing integration densities, feature sizes are becoming increasingly smaller, which leads to problems with etch bias effects and optical proximity effects, which can distort the final printed image of a circuit layout. In order to compensate for these effects, circuit layouts are typically modified through etch bias correction and optical proximity correction operations. Artifacts, such as serifs, which are generated by these correction operations, can cause difficulties in identifying line-end features.

Currently existing techniques for line-end detection suffer from low-precision when handling data with a high amount of noise, and from the difficulty in processing runs in directions such as 30 degrees and 45 degrees. These difficulties largely arise because the artifacts introduced by etch bias correction and optical proximity correction tend to generate noise, which obscures the line-end features.

Hence, what is needed is a method and an apparatus for identifying line-end features for lithography verification without the above-described problems.

SUMMARY

One embodiment of the invention provides a system that facilitates identifying line-end features in a layout for an integrated circuit. The system operates by first receiving the layout for the integrated circuit. Next, the system selects a polygon from the layout and marks a line-end seed on the polygon. The system then determines if the line-end seed is associated with a line-end feature, and if so, the system marks the line-end feature.

In a variation of this embodiment, marking the line-end seed on the polygon involves performing a linear search of the polygon to identify and mark each line-end seed that is encountered.

In a further variation, the line-end seed is a horizontal edge in a boundary representation of the polygon, wherein both vertices of the horizontal edge are convex (downward) vertices, and wherein the length of the horizontal edge is less than a maximum line end width.

In a further variation, the system sorts the line-end seeds in descending spatial order based upon their y coordinate.

In a further variation, the system determines if the line-end seed is associated with the line-end feature by first constructing a continuous edge list, wherein the continuous edge list includes a series of contiguous edges that define the polygon. Next, the system locates a minimum bounding box for the continuous edge list, wherein: the edges of the minimum bounding box are parallel to the x axis and the y axis, and contain the line-end seed as the highest edge in the y coordinate. Furthermore, the y-dimension of the minimum bounding box is at least a minimum line end height, and the x-dimension of the minimum bounding box is at most a maximum line end width.

In a further variation, determining if the line-end seed is associated with a line-end feature involves first setting a minimum bounding box for the current line-end seed and marking the seed as visited. Next, the system scans the left side of the line-end seed to locate a leftward descending edge, that is, by adding this edge the minimum y-coordinate of the edges on the left side of the line-end seed will get smaller. If the width of the new bounding box of the current line-end seed and the leftward descending edge is less than a maximum line-end width, the system adds all the edges between the seed and the leftward descending edge to the current edge list, and marks all the newly added edges as visited. Marking the edges as visited prevents revisiting these edges. The system then scans the right side of the line-end seed to locate a rightward descending edge, that is, by adding this edge the minimum y-coordinate of the edges on the right side of the line-end seed will get smaller. If the width of the new bounding box of the current line-end seed and the rightward descending edge is less than a maximum line-end width, the system adds all the edges between the seed and the rightward descending edge to the current edge list, and marks all the newly added edges as visited. The system repeats the steps of scanning the side, adding the edge, and marking the edge, alternately on the left and right side until the width of the current bounding box is maximized at less-than or equal-to the maximum line-end width. The system then compares the y-coordinate distance between both the last edge on the left and the last edge on the right to the line-end seed. If the minimum of these distances is equal-to or greater-than the minimum line-end height, the edge list between the last left scan edge and the last right scan edge is a line feature.

In a further variation, the system repeatedly selects another polygon and repeats the steps of selecting the polygon, marking the line-end seed, determining if the line-end seed is associated with a line-end feature, and marking the line-end feature, until each polygon in the layout has been selected.

In a further variation, the system rotates the layout through a given angle and processes each polygon to classify line-end features in the rotated orientation. The given angle can be, 30 degrees, 45 degrees, 60 degrees, 90 degrees, 120 degrees, 135 degrees, or 150 degrees.

In a further variation, the system repeats the steps of rotating the layout and processing each polygon until each angle has been selected In a further variation, identifying line-end features includes identifying space-end features, wherein a space-end feature is a negative image of a line-end feature of the layout.

DETAILED DESCRIPTION

Data Flow

Figure 1:
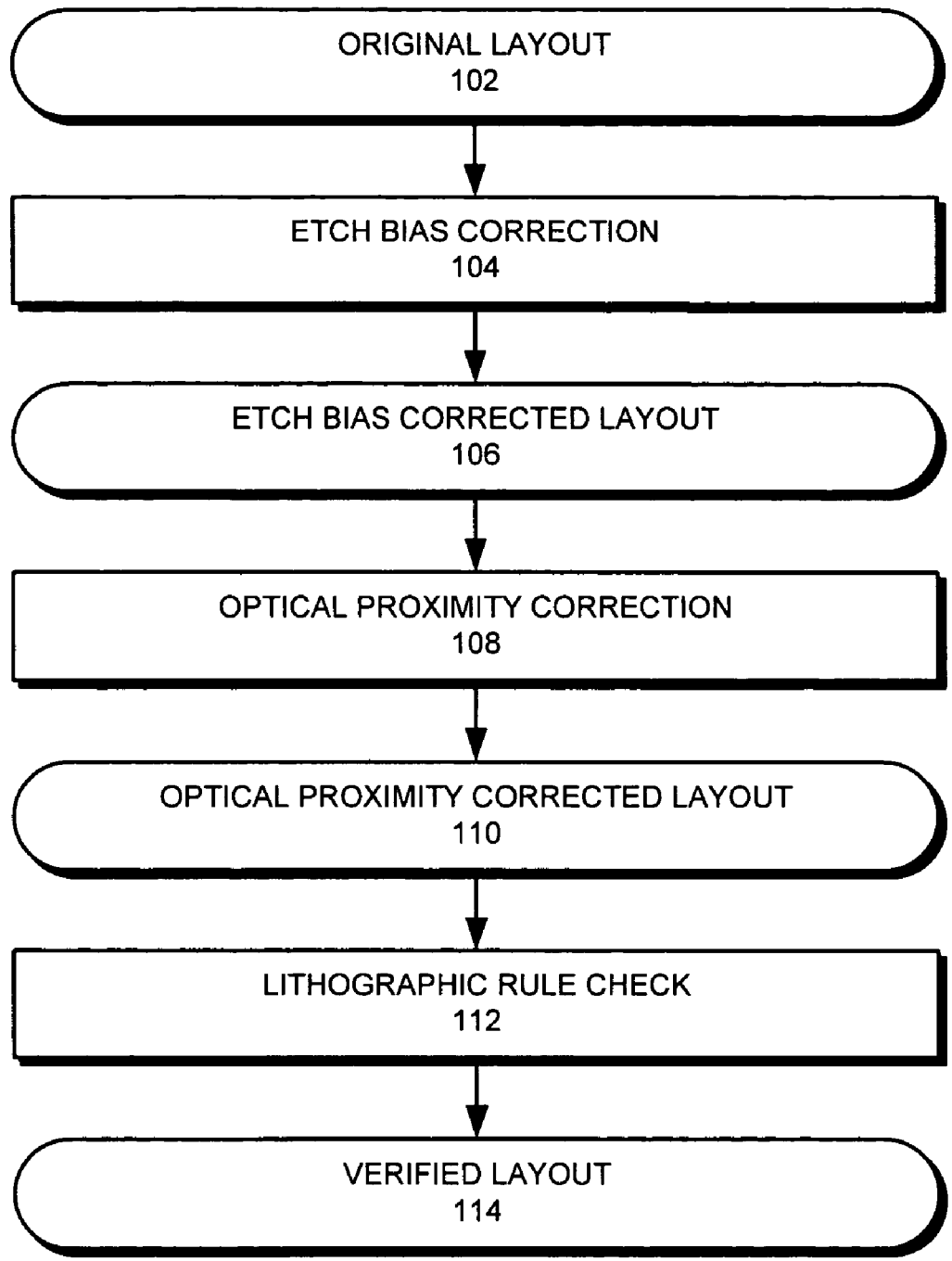
FIG. 1 illustrates process flow in accordance with an embodiment of the invention.

FIG. 1 illustrates a process flow in accordance with an embodiment of the invention. The system starts with original layout 102. Original layout 102 is then processed for etch bias correction 104 resulting in an etch-bias-corrected layout 106. Next, the etch-bias-corrected layout 106 is subjected to optical proximity correction 108 yielding optical-proximity-corrected layout 110. Optical-proximity-corrected layout 110 is then subjected to a lithographic rule check 112, which results in verified layout 114.

Artifacts Added by Corrections

Figure 2:
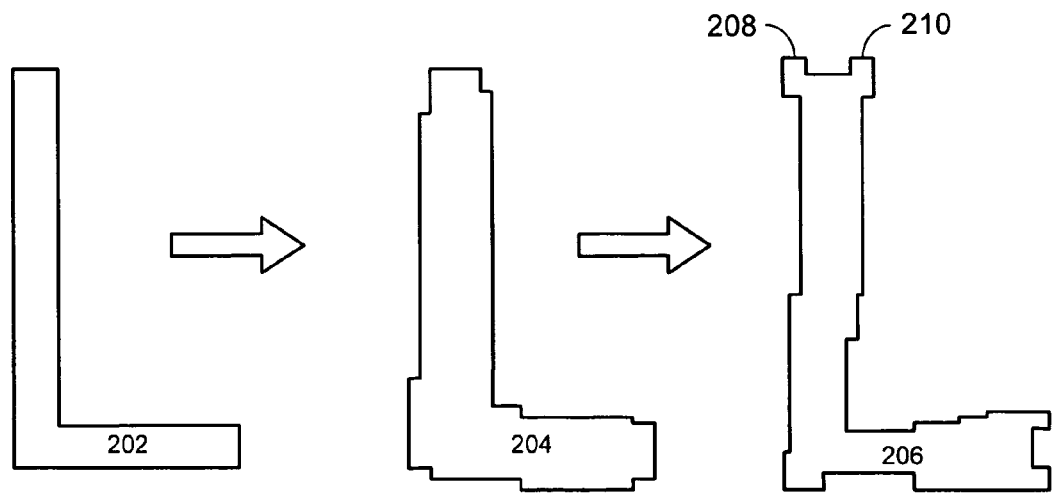
FIG. 2 illustrates artifacts added to a polygon during etch bias correction and optical proximity correction in accordance with an embodiment of the invention.

FIG. 2 illustrates artifacts added to a polygon during etch bias correction and optical proximity correction in accordance with an embodiment of the invention. A polygon 202 from original layout 102 is shown in FIG. 2. Note that identifying line-ends on polygon 202 is a straight-forward process and can be accomplished with relatively simple calculations.

The etch-bias correction process 104 transforms polygon 202 into polygon 204. Polygon 204 includes artifacts, which have been added by the etch-bias-correction process 104 to correct for etch-biasing effects in the later processes, which print the feature on an integrated circuit die.

Optical proximity correction process 108 further transforms polygon 204 into polygon 206. Polygon 206 includes additional artifacts, which have been added by optical proximity correction process 206. These additional artifacts assist in correcting for optical proximity effects in subsequent processes, which print the feature on an integrated circuit die. Note that although these corrections cause the final printed image of the polygon on the integrated circuit to more closely match the original polygon 202, they make the process of identifying the line-end features very difficult. For example, either of serifs 208 or 210, which were added by the correction processes, can be mistakenly ignored by the simple software, which would correctly identify the line ends of polygon 202.

Line-End Seed

Figure 3:
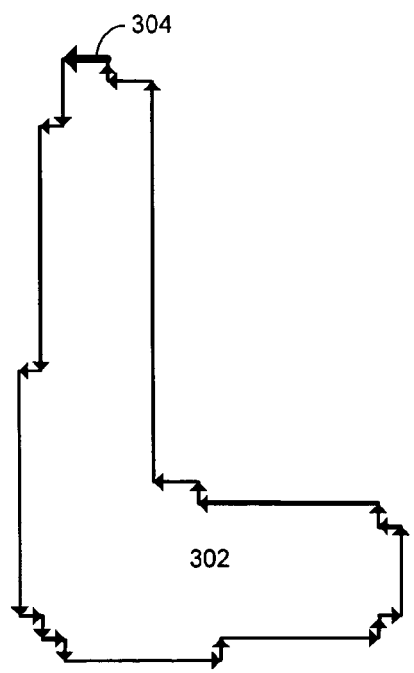
FIG. 3 illustrates a line-end seed in accordance with an embodiment of the invention.

FIG. 3 illustrates a line-end seed 304 in accordance with an embodiment of the invention. A line-end seed is identified by performing a counter-clockwise boundary scan of a polygon. When an edge is located in this boundary scan that is horizontal, both vertices of the edge are convex (downward), and the length of the edge is less than a given maximum line end width, the edge is marked as a line-end seed. As illustrated in FIG. 3, polygon 302 includes line-end seed 304.

Bounding Box

Figure 4:
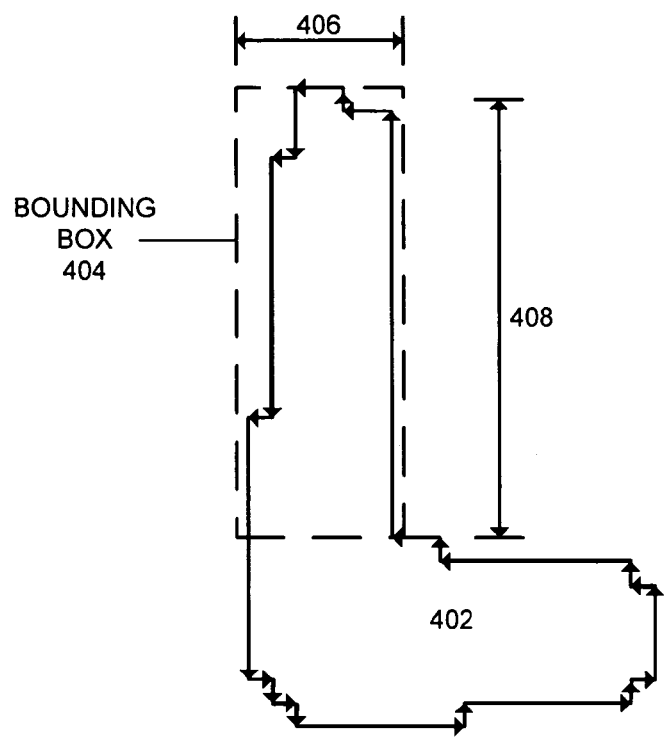
FIG. 4 illustrates a minimum bounding box in accordance with an embodiment of the invention.

FIG. 4 illustrates a minimum bounding box 404 for the vertical (90 degrees) line feature in the polygon 402 in accordance with an embodiment of the invention. Determining minimum bounding box 404 involves finding a continuous edge list that includes a line-end seed and then forming a minimum bounding box, which includes the continuous edge list. The edges of minimum bounding box 404 are constructed parallel to the x and y axes. The horizontal dimension 406 of minimum bounding box 404 must be no greater than a given maximum while the vertical dimension 408 of minimum bounding box 404 must be no less than a given minimum. Note that the given maximum of the horizontal dimension and the given minimum of the vertical dimension are chosen so that minimum bounding box 404 accurately identifies line-end features. This process is performed on each polygon in the layout and is performed at each rotation angle used in constructing the original layout. Typical angles include 0 degrees, 30 degrees, 45 degrees, 60 degrees, 90 degrees, 120 degrees, 135 degrees, and 150 degrees. Other angles can be defined as required by the designer.

Constructing a continuous edge list that includes a line-end seed involves scanning both the left side and the right side of the seed repeatedly, until the width of the scan is equal-to the maximum line-end width. The system then measures the y-coordinate difference between the seed and the last edge in the left scan and the right scan. If the difference is equal-to or greater-than the minimum line-end height, then the edge list between the last left scan edge and the last right scan edge is a line-feature.

Marking Edges

Figure 5:
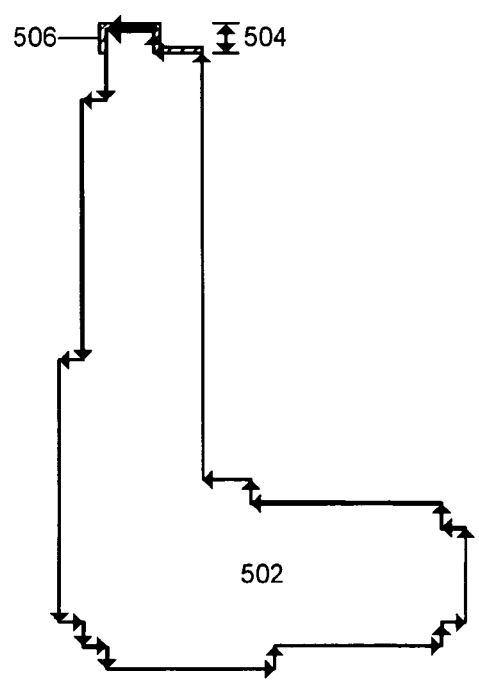
FIG. 5 illustrates the process of marking edges in accordance with an embodiment of the invention.

FIG. 5 illustrates the process of marking edges in accordance with an embodiment of the invention. The edges 506 defining a line end of polygon 502 are marked as shown in FIG. 5. Note that mark size 504 is used to control how far edges 506 are marked in the vertical direction.

Marking Centers

Figure 6:
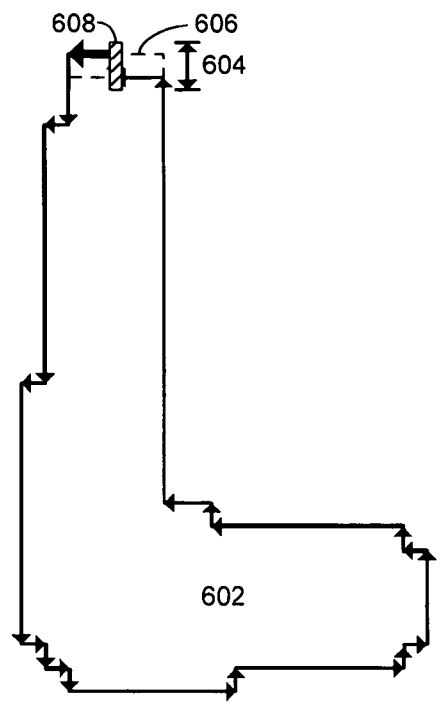
FIG. 6 illustrates the process of marking centers in accordance with an embodiment of the invention.

FIG. 6 illustrates the process of marking centers in accordance with an embodiment of the invention. As above, the mark size defines the vertical dimension of a bounding box 606 bounding the edges of a line end of polygon 602. The center of mark 608 is centered in bounding box 606 and the height 604 of mark 608 is two times the mark size.

Marking the Inner Axis

Figure 7:
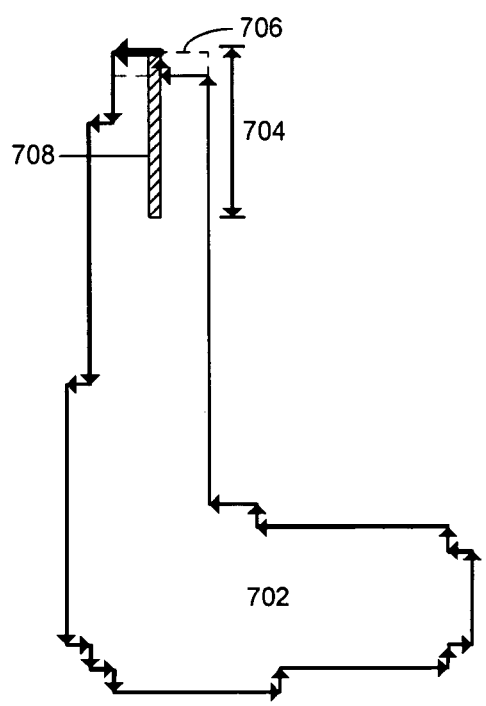
FIG. 7 illustrates the process of marking an inner axis in accordance with an embodiment of the invention.

FIG. 7 illustrates the process of marking an inner axis in accordance with an embodiment of the invention. Mark size 704 defines the vertical size of mark 708 in polygon 702. Mark 708 is centered horizontally in box 706, which bounds the line-ends and extends downward for a length of mark size 704.

Finding and Marking Line-End Features

Figure 8:
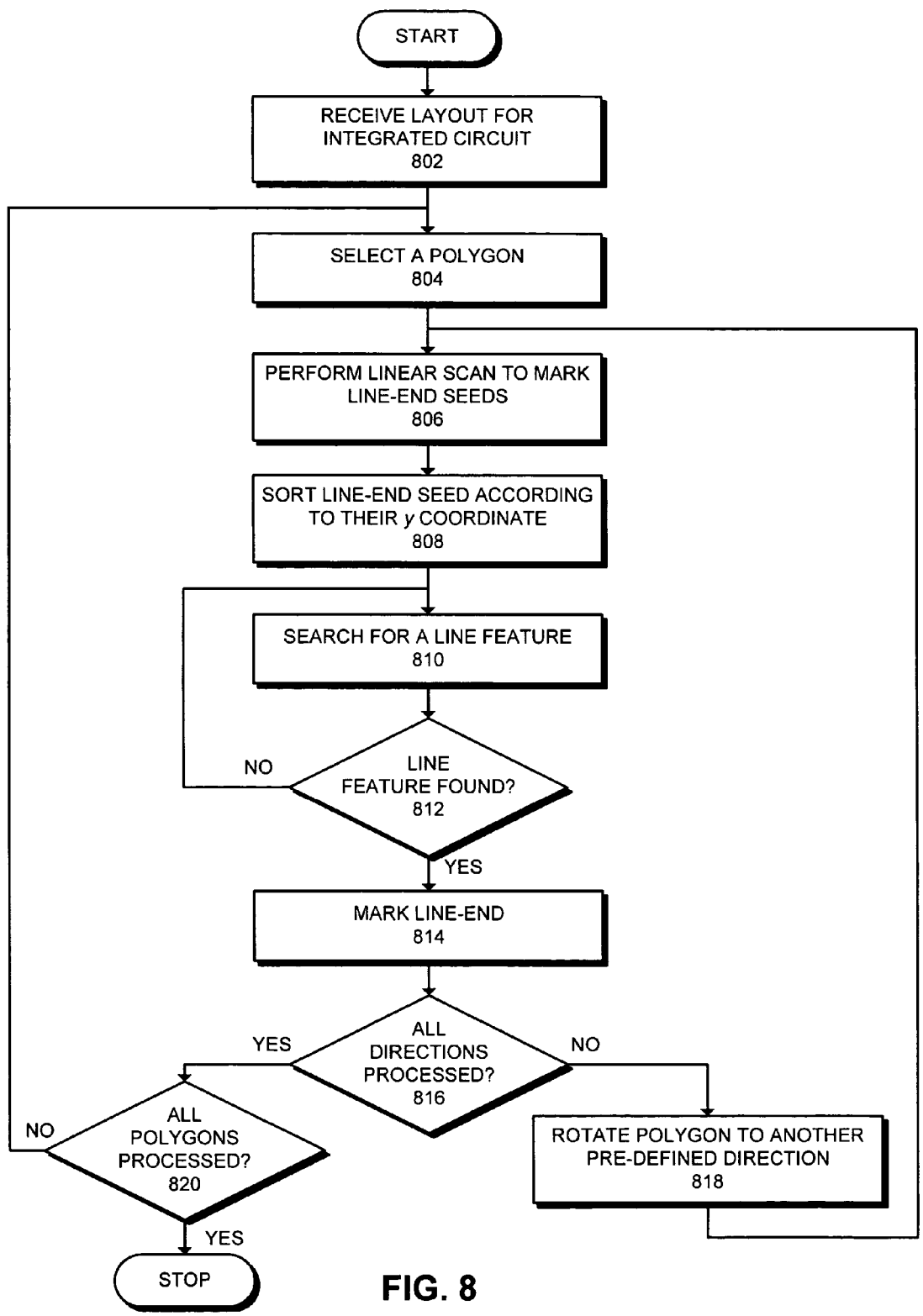
FIG. 8 presents a flowchart illustrating the process of finding and marking line-end features in accordance with an embodiment of the invention.

FIG. 8 presents a flowchart illustrating the process of finding and marking line-end features in accordance with an embodiment of the invention. The system starts when a layout for an integrated circuit is received (Step 802). Next, the system selects a polygon from the layout (step 804). The system then performs a linear boundary scan of the polygon and marks the line-end seeds (step 806).

After the line-end seeds have been marked, the system sorts the line-end seeds according to their y coordinate (step 808). The system then searches for a line-end feature starting with the line-end seed with the greatest unvisited y coordinate (step 810). If a given line-end seed is not part of a line-end feature, the system continues at step 810 to search the remaining line-end seeds (step 812).

If a line feature is found at step 812, the system marks the line-end as described above in conjunction with FIG. 5, 6, or 7 (step 814). After marking the line-end, the system next determines if all of the directions have been processed for the polygon (step 816). If not, the system rotates the polygon to try another predefined direction (step 818) and returns to step 806 to identify line-end features in this orientation.

After all of the directions have been processed at step 816, the system determines if all polygons in the layout have been processed (step 820). If not, the system returns to step 804 and selects another polygon. Otherwise, the process is finished.

Finding a Line Feature

Figure 9:
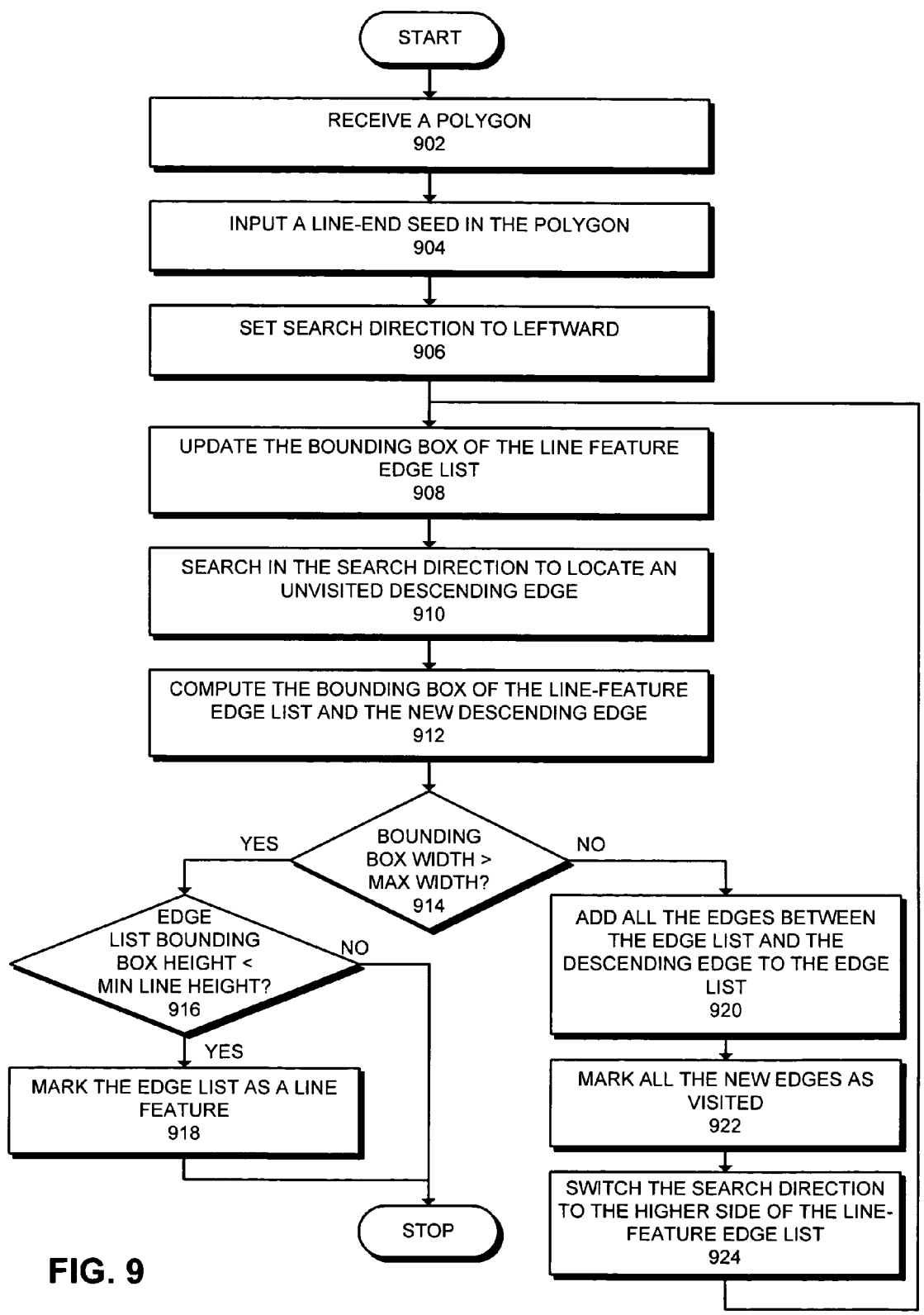
FIG. 9 presents a flowchart illustrating the process of finding a line feature in accordance with an embodiment of the invention.

FIG. 9 presents a flowchart illustrating the process of finding a line feature in accordance with an embodiment of the invention. The system starts when a polygon is received (step 902). Next, the inputs a line-end seed in the polygon (step 904). The system then sets the search direction to leftward (step 906).

The system updates the bounding box of the line feature edge list (step 908). Next, the system searches in the search direction to locate an unvisited descending edge (step 910). The system then computes the bounding box of the line-feature edge list and the new descending edge (step 912).

The system determines if the bounding box width is greater than the maximum width (step 914). If so, the system then determines if the edge list bounding box height is less than a minimum line height (step 916). If so, the system marks the edge list as a line feature (step 918). Otherwise, the edge list is not a line feature and the process is terminated.

If the bounding box width is not greater than the maximum width at step 914, the system adds all the edges between the edge list and the descending edge to the edge list (step 920). The system then marks all the new edges as visited (step 922). If in the current direction the minimum y-coordinate gets lower than the other direction, the system switches the search direction between left and right so that alternate passes are in the opposite direction (step 924). The system then returns to step 908 and continues.

CONCLUSION

The foregoing description is presented to enable one to make and use the invention, and is provided in the context of a particular application and its requirements. It is not intended to be exhaustive or to limit the invention to the forms disclosed. Various modifications to the disclosed embodiments will be readily apparent, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein. Accordingly, many modifications and variations will be apparent. The scope of the invention is defined by the appended claims.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

Note that the invention can be applied to any type of lithographic process for fabricating semiconductor chips, including processes that make use of, deep-ultraviolet (DUV) radiation, extreme ultraviolet (EUV) radiation, X-rays, and electron beams, along with suitably modified masks.

What is claimed is:

1. A method for identifying line-end features in a layout for an integrated circuit, comprising:
   receiving the layout for the integrated circuit;
   selecting a polygon from the layout;
   marking a line-end seed on the polygon;
   wherein marking the line-end seed on the polygon involves performing a linear search of the polygon to identify and mark each line-end seed on the feature;
   wherein the line-end seed is a horizontal edge in a boundary representation of the polygon;
   wherein both vertices of the horizontal edge are convex (downward) vertices; and
   wherein a length of the horizontal edge is less than a given maximum line-end width;
   determining if the line-end seed is associated with a line feature;
   if so, marking a line-end feature in the line feature; and
   using the line-end feature for lithography verification of the layout.

2. The method of claim 1, further comprising sorting the line-end seeds in descending spatial order based upon their y coordinate.

3. The method of claim 1, wherein determining if the line-end seed is associated with the line-end feature involves:
   constructing a continuous edge list, wherein the continuous edge list includes a series of contiguous edges that define the polygon;
   locating a minimum bounding box for the line-end seed and the continuous edge list, wherein:
     the edges of the minimum bounding box are parallel to the x axis and the y axis,
     the continuous edge list includes the line-end seed as its highest edge in the y coordinate,
     the y-dimension of the minimum bounding box is at least a minimum line-end height, and
     the x-dimension of the minimum bounding box is at most a maximum line-end width.

4. The method of claim 1, wherein determining if the line-end seed is associated with a line feature involves:
   inputting a line-end seed into the polygon;
   setting a search direction to leftward;
   updating a bounding box of the line feature edge list;
   searching in the search direction to locate an unvisited descending edge;
   computing the bounding box of the line-feature edge list and the new descending edge;
   if the bounding box width is greater than a given maximum width,
     if the edge list bounding box height is not less than a given minimum line height, marking the edge list as a line feature;
   if the bounding box width is not greater than a given maximum width, adding all the edges between the edge list and the descending edge to the edge list, marking all the new edges as visited, and if the minimum y-coordinate of edges that are on the current search side of the line-end seed in the line feature edge list is lower than the minimum y-coordinate of the other side, switching the search direction to the higher minimum y-coordinate side of the line-end seed, and repeating the steps of updating, searching, and computing until the bounding box width is greater than a given maximum width.

5. The method of claim 1, further comprising repeatedly selecting a next polygon and repeating the steps of receiving the layout, marking the line-end seed, determining if the line-end seed is associated with a line feature, and marking the line-end feature in a line feature until each polygon in the layout has been selected.

6. The method of claim 5, further comprising rotating the layout through a given angle and processing each polygon to classify line-end features in the rotated orientation, wherein the given angle is one of 30, degrees, 45 degrees, 60 degrees, 90 degrees, 120 degrees, 135 degrees, and 150 degrees.

7. The method of claim 6, further comprising repeating the steps of rotating the layout and processing each polygon until each angle has been selected.

8. The method of claim 1, wherein identifying line-end features includes identifying space-end features, wherein a space-end feature is a negative image of a line-end feature of the layout.

9. A computer-readable storage medium storing instructions that when executed by a computer cause the computer to perform a method for identifying line-end features in a layout for an integrated circuit, the method comprising:

receiving the layout for the integrated circuit;

selecting a polygon from the layout;

marking a line-end seed on the polygon;

wherein marking the line-end seed on the polygon involves performing a linear search of the polygon to identify and mark each line-end seed on the feature;

wherein the line-end seed is a horizontal edge in a boundary representation of the polygon;

wherein both vertices of the horizontal edge are convex (downward) vertices; and wherein a length of the horizontal edge is less than a given maximum line-end width;

determining if the line-end seed is associated with a line-end feature;

if so, marking the line-end feature; and using the line-end feature for lithography verification of the layout.

10. The computer-readable storage medium of claim 9, the method further comprising sorting the line-end seeds in descending spatial order based upon their y coordinate.

11. The computer-readable storage medium of claim 9, wherein determining if the line-end seed is associated with the line-end feature involves:

constructing a continuous edge list, wherein the continuous edge list includes a series of contiguous edges that define the polygon;

locating a minimum bounding box for the line-end seed and the continuous edge list, wherein:

the edges of the minimum bounding box are parallel to the x axis and the y axis, the continuous edge list includes the line-end seed as its highest edge in the y coordinate, the y-dimension of the minimum bounding box is at least a minimum line-end height, and the x-dimension of the minimum bounding box is at most a maximum line-end width.

12. The computer-readable storage medium of claim 9, wherein determining if the line-end seed is associated with a line-end feature involves:

inputting a line-end seed into the polygon;

setting a search direction to leftward;

updating a bounding box of the line feature edge list;

searching in the search direction to locate an unvisited descending edge;

computing the bounding box of the line-feature edge list and the new descending edge;

if the bounding box width is greater than a given maximum width, if the edge list bounding box height is not less than a given minimum line height, marking the edge list as a line feature;

if the bounding box width is not greater than a given maximum width, adding all the edges between the edge list and the descending edge to the edge list, marking all the new edges as visited, and if the minimum y-coordinate of the edges that are on the current search side of the line-end seed in the line feature edge list is lower than the minimum y-coordinate of the other side, switching the search direction to the higher minimum y-coordinate side of the line-end seed, and repeating the steps of updating, searching, and computing until the bounding box width is greater than a given maximum width.

13. The computer-readable storage medium of claim 9, the method further comprising repeatedly selecting a next polygon and repeating the steps of receiving the layout, marking the line-end seed, determining if the line-end seed is associated with a line feature, and marking the line-end feature in each line feature until each polygon in the layout has been selected.

14. The computer-readable storage medium of claim 13, the method further comprising rotating the layout through a given angle and processing each polygon to classify line-end features in the rotated orientation, wherein the given angle is one of, 30 degrees, 45 degrees, 60 degrees, 90 degrees, 120 degrees, 135 degrees, and 150 degrees.

15. The computer-readable storage medium of claim 14, the method further comprising repeating the steps of rotating the layout and processing each polygon until each angle has been selected.

16. The computer-readable storage medium of claim 9, wherein identifying line-end features includes identifying space-end features, wherein a space-end feature is a negative image of a line-end feature of the layout.

17. An apparatus for identifying line-end features in a layout for an integrated circuit, comprising:

a receiving mechanism configured to receive the layout for the integrated circuit;

a selecting mechanism configured to select a polygon from the layout;

a marking mechanism configured to mark a line-end seed on the polygon;

wherein marking the line-end seed on the polygon involves performing a linear search of the polygon to identify and mark each line-end seed on the feature;

wherein the line-end seed is a horizontal edge in a boundary representation of the polygon;

wherein both vertices of the horizontal edge are convex (downward) vertices; and wherein a length of the horizontal edge is less than a given maximum line-end width;

a determining mechanism configured to determine if the line-end seed is associated with a line-end feature; and a marking mechanism configured to mark the line-end feature if the line-end seed is associated with a line-end feature;

wherein the line-end feature is used for lithography verification of the layout.

18. The apparatus of claim 17, further comprising a sorting mechanism configured to sort the line-end seeds in descending spatial order based upon their y coordinate.

19. The apparatus of claim 17, further comprising;

a constructing mechanism configured to construct a continuous edge list, wherein the continuous edge list includes a series of contiguous edges that define the polygon a locating mechanism configured to locate a minimum bounding box for the line-end seed and the continuous edge list, wherein:

the edges of the minimum bounding box are parallel to the x axis and they axis, the continuous edge list includes the line-end seed as its highest edge in they coordinate, the y-dimension of the minimum bounding box is at least a minimum line-end height, and the x-dimension of the minimum bounding box is at most a maximum line-end width.

20. The apparatus of claim 17, wherein determining if the line-end seed is associated with a line-end feature involves:

inputting a line-end seed into the polygon;

setting a search direction to leftward;

updating a bounding box of the line feature edge list;

searching in the search direction to locate an unvisited descending edge;

computing the bounding box of the line-feature edge list and the new descending edge;

if the bounding box width is greater than a given maximum width, if the edge list bounding box height is not less than a given minimum line height, marking the edge list as a line feature;

if the bounding box width is not greater than a given maximum width, adding all the edges between the edge list and the descending edge to the edge list, marking all the new edges as visited, and if the minimum y-coordinate of the edges that are on the current search side of the line-end seed in the line feature edge list is lower than the minimum y-coordinate of the other side, switching the search direction to the higher minimum y-coordinate side of the line-end seed, and repeating the steps of updating, searching, and computing until the bounding box width is greater than a given maximum width.

21. The apparatus of claim 17, wherein the selecting mechanism is further configured to repeatedly select a next polygon; and a repeating mechanism configured to repeat the steps of selecting the polygon, marking the line-end seed, determining if the line-end seed is associated with a line feature, and marking the line-end feature in each line feature until each polygon in the layout has been selected.

22. The apparatus of claim 21, further comprising a rotating mechanism configured to rotate the layout through a given angle and processing each polygon to classify line-end features in the rotated orientation, wherein the given angle is one of, 30 degrees, 45 degrees, 60 degrees, 90 degrees, 120 degrees, 135 degrees, and 150 degrees.

23. The apparatus of claim 22, wherein the repeating mechanism is further configured to repeat the steps of rotating the layout and processing each polygon until each angle has been selected.

24. The Apparatus of claim 17, wherein identifying line-end features includes identifying space-end features, wherein a space-end feature is a negative image of a line-end feature of the layout.

* * * * *

UNITED STATES PATENT AND TRADEMARK OFFICE
CERTIFICATE OF CORRECTION

PATENT NO.         : 7,194,712 B2                                   Page 1 of 1
APPLICATION NO.    : 10/845566
DATED              : March 20, 2007
INVENTOR(S)        : James Xiaqing Wu It is certified that error appears in the above-identified patent and that said Letters Patent is hereby corrected as shown below:

In claim 19 (at column 9, line 22), please delete the words, "they axis" and replace with the words --the y axis--.

In claim 19 (at column 9, line 24), please delete the words, "they coordinate" and replace with the words --the y coordinate--.

Signed and Sealed this

Twenty-second Day of May, 2007

JON W. DUDAS
*Director of the United States Patent and Trademark Office*